United States Patent
Briggs et al.

(10) Patent No.: US 10,211,138 B2
(45) Date of Patent: Feb. 19, 2019

(54) METAL SILICATE SPACERS FOR FULLY ALIGNED VIAS

(71) Applicant: International Business Machines Corporation, Armonk, NY (US)

(72) Inventors: Benjamin D. Briggs, Waterford, NY (US); Jessica Dechene, Watervliet, NY (US); Elbert Huang, Mountain View, CA (US); Joe Lee, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/983,672

(22) Filed: May 18, 2018

(65) Prior Publication Data

US 2018/0269144 A1 Sep. 20, 2018

Related U.S. Application Data

(62) Division of application No. 15/251,450, filed on Aug. 30, 2016, now Pat. No. 10,049,974.

(51) Int. Cl.
| | |
|---|---|
| H01L 23/48 | (2006.01) |
| H01L 23/498 | (2006.01) |
| H01L 21/48 | (2006.01) |
| H01L 23/532 | (2006.01) |
| H01L 23/528 | (2006.01) |

(52) U.S. Cl.
CPC .... *H01L 23/49827* (2013.01); *H01L 21/4803* (2013.01); *H01L 21/486* (2013.01); *H01L 21/4846* (2013.01); *H01L 23/498* (2013.01); *H01L 23/49838* (2013.01); *H01L 23/49872* (2013.01); *H01L 23/49894* (2013.01); *H01L 23/5329* (2013.01); *H01L 23/53209* (2013.01);
(Continued)

(58) Field of Classification Search
None
See application file for complete search history.

(56) References Cited

U.S. PATENT DOCUMENTS

| | | | | |
|---|---|---|---|---|
| 6,008,117 A | * | 12/1999 | Hong | H01L 21/76826 257/E21.576 |
| 7,368,377 B2 | * | 5/2008 | Whelan | B82Y 30/00 438/643 |

(Continued)

OTHER PUBLICATIONS

List of IBM Patents or Patent Applications Treated as Related; (Appendix P), Filed May 18, 2018; 2 pages.

*Primary Examiner* — Hung Vu
(74) *Attorney, Agent, or Firm* — Cantor Colburn LLP; Vazken Alexanian

(57) ABSTRACT

A multi-level semiconductor device and a method of fabricating a multi-level semiconductor device involve a first interlayer dielectric (ILD) layer with one or more metal lines formed therein. A silicide is formed on a surface of the first ILD layer and is directly adjacent to each of the one or more metal lines on both sides of each of the one or more metal lines. A second ILD is formed above the silicide, and a via is formed through the second ILD above one of the one or more metal lines. One or more second metal lines are formed above the second ILD, one of which is formed in the via. The second metal line in the via contacts the one of the one or more metal lines and the silicide adjacent to the one of the one or more metal lines.

20 Claims, 10 Drawing Sheets

(52) U.S. Cl.
CPC ...... *H01L 23/53295* (2013.01); *H01L 23/528* (2013.01)

(56) References Cited

U.S. PATENT DOCUMENTS

| | | | |
|---|---|---|---|
| 7,727,882 B1 * | 6/2010 | Wu | H01L 21/2855 |
| | | | 257/E21.584 |
| 9,349,687 B1 | 5/2016 | Gates et al. | |
| 2015/0179579 A1 * | 6/2015 | Jezewski | H01L 21/76846 |
| | | | 257/753 |
| 2018/0061750 A1 | 3/2018 | Briggs et al. | |

* cited by examiner

METAL SILICATE SPACERS FOR FULLY ALIGNED VIAS

DOMESTIC PRIORITY

This application is a division of U.S. application Ser. No. 15/251,450 filed Aug. 30, 2016, the disclosure of which is incorporated herein by reference in its entirety.

BACKGROUND

The present invention relates to semiconductor device manufacturing, and more specifically, to metal silicate spacers for fully aligned vias in interconnect structures.

Semiconductor integrated circuits or chips include a number of devices that are connected by a wiring interconnect network. When the devices are arranged on multiple levels, a given interconnect can traverse the chip across a given level or between levels through vias. Proper alignment of the vias with the interconnect below is required, because overlay error can affect reliability. Overlay error refers to the situation in which the via is not aligned with the interconnect below but can also refer to misalignment of the via such that some of the interconnect formed in the via is adjacent to rather than entirely above the interconnect on the lower level. When the intersection between the via and the interconnect in the level below is too small, electromigration failure can result. When the via is misaligned and the misalignment affects the spacing between adjacent interconnects, then time dependent dielectric breakdown can result. Thus, proper alignment of vias with their associated lower-level interconnects is of interest.

SUMMARY

According to one or more embodiments of the present invention, a method of fabricating a multi-level semiconductor device includes forming two or more metal lines in a first inter-layer dielectric (ILD), forming recessed openings based on respectively recessing the two or more metal lines below a top surface of the first ILD, and forming a silicate at the top surface of the first ILD. A dielectric cap is formed on the silicate and on the two or more metal lines. The method also includes forming a second ILD on the dielectric cap, forming a metal trench hardmask above the second ILD, and forming a metal trench pattern in the metal trench hardmask. A portion of the metal trench pattern is above a portion of the recessed openings. Via patterns are formed, and each via pattern is formed above a portion of the metal trench pattern. Via openings are formed based on transferring the via patterns to a lower level. The via opening is self-aligned to the metal trench pattern in a first direction and to the silicate in a second direction, and higher level metal lines are formed that interconnect with the two or more metal lines through the via openings.

According to one or more embodiments of the present invention, a multi-level semiconductor device includes a first interlayer dielectric (ILD) layer with one or more metal lines formed therein. A silicide is formed on a surface of the first ILD layer. The silicide is directly adjacent to each of the one or more metal lines on both sides of each of the one or more metal lines. A second ILD is formed above the silicide, and a via is formed through the second ILD above one of the one or more metal lines. One or more second metal lines formed above the second ILD. The one of the one or more second metal lines is formed in the via, and the second metal line in the via contacts the one of the one or more metal lines and the silicide adjacent to the one of the one or more metal lines.

According to one or more embodiments of the present invention, a method of forming a via in a multi-level semiconductor device includes forming metal silicate etch stop spacers directly adjacent to a metal line on a lower level of the multi-level semiconductor device, the metal silicate etch stop spacers comprising a silicate top surface on an inter-layer dielectric (ILD). A metal trench hardmask is formed above a second ILD that is formed above the lower level of the multi-level semiconductor device, and a metal trench pattern is formed in the metal trench hardmask. A portion of the metal trench pattern is above a portion of the metal line. The method also includes forming a via pattern. The via pattern is formed above a portion of the metal trench pattern. Forming via openings is based on transferring the via patterns to a lower level, and the via opening is self-aligned to the metal trench pattern in a first direction and to the silicate in a second direction.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-11 show processes involved in via formation according to one or more embodiments, in which:

FIG. 1 shows both an isometric projection and a corresponding front view of an intermediate structure used to form of a semiconductor device;

FIG. 2 shows the intermediate structure that results from etching metal lines;

FIG. 3 indicates the silicate that is formed on the lower level inter-layer dielectric surface;

FIG. 4 shows the intermediate structure that results from deposition of a conformal dielectric cap on the structure shown in FIG. 3;

FIG. 5 shows side and isometric views of an intermediate structure resulting from processing of the intermediate structure shown in FIG. 4;

FIG. 6 shows the result of etching a metal trench pattern in the metal trench hardmask;

FIG. 7 is an isometric view that shows via patterns formed in a via pattern material;

FIG. 8 is a top view of the structure shown in FIG. 7;

FIG. 9 results from an etch of the structure shown in FIGS. 7 and 8;

FIG. 10 is a top view of the structure shown in FIG. 9; and

FIG. 11 shows higher level metal lines deposited in the higher level trenches to form vias.

DETAILED DESCRIPTION

As previously noted, sufficient and correct alignment of vias with interconnects above which the vias are formed is necessary to prevent reliability issues in a multi-level chip. A known approach to obtaining aligned vias includes forming a metal trench hardmask layer above an inter layer dielectric (ILD) that separates two levels of interconnects and through which the via is formed. A metal trench pattern is formed in the metal trench hardmask, and the via pattern is self-aligned to the metal trench pattern.

Turning now to an overview of the present invention, one or more embodiments relate to forming a silicate from the dielectric layer in which the lower level interconnect is formed. This silicate is formed below the metal trench hardmask layer. While the metal trench pattern in the metal trench hardmask facilitates self-alignment of the via pattern in one direction, the silicate facilitates alignment of the via in another (perpendicular) direction.

Figure 1:
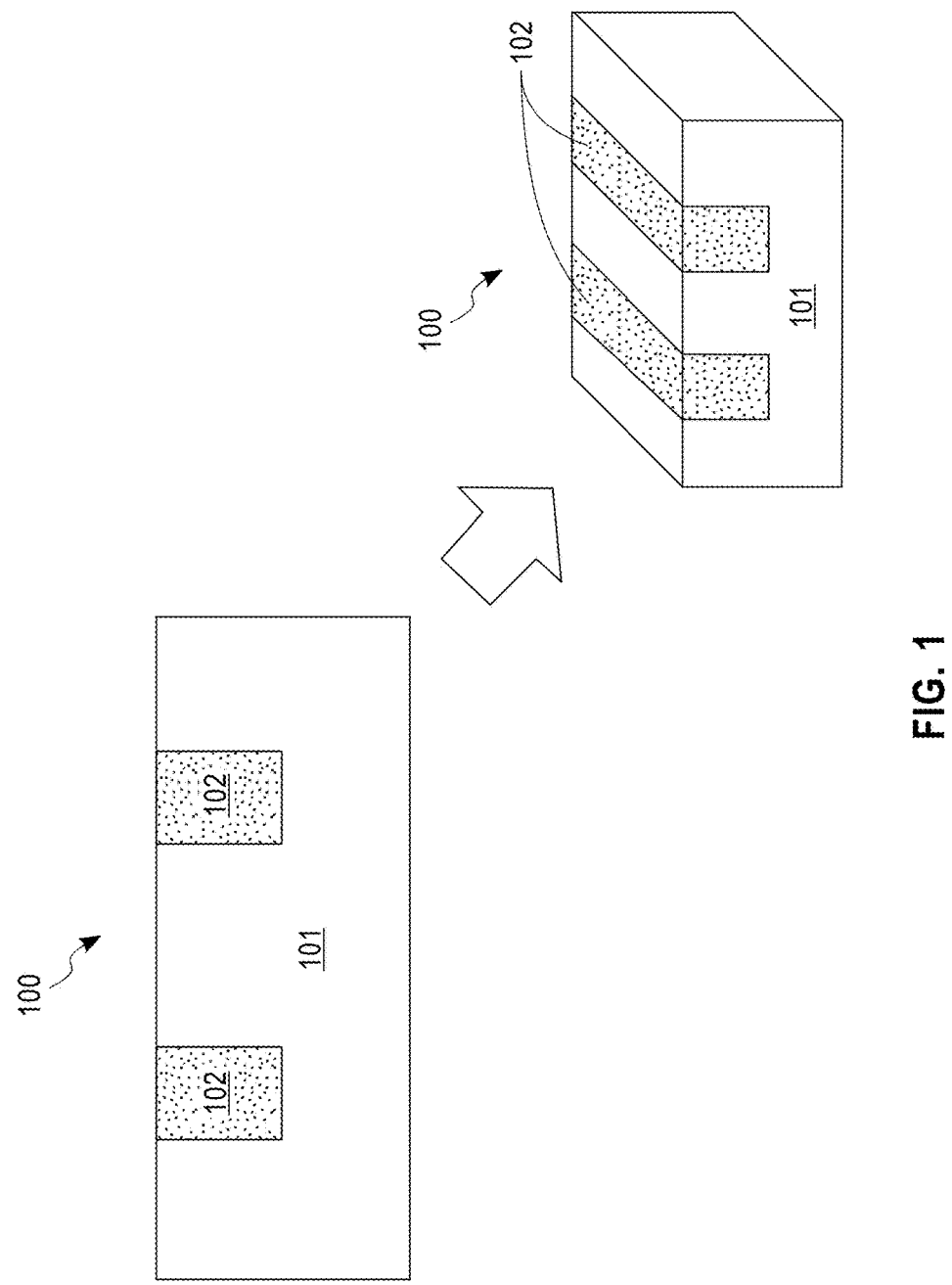

Turning now to a more detailed description of one or more embodiments, FIGS. 1-11 show processes involved in the via formation. FIG. 1 shows both an isometric projection and a corresponding front view of an intermediate structure 100 used to form of a semiconductor device according to an exemplary embodiment. The exemplary intermediate structure 100 includes two metal lines 102 formed on a first ILD layer 101. The first ILD layer 101 may be comprised of any known materials such as porous silicates, carbon doped oxides, silicon dioxides, silicon nitrides, silicon oxynitrides, or other dielectric materials. The metal lines 102 can be any known conductive materials such as copper (Cu), aluminum (Al), or tungsten (W), for example. The fabrication of the metal lines 102 can be according to known techniques such as a single or dual damascene technique. The metal lines 102 can be Cu and include a metal liner comprised of tantalum nitride and tantalum (TaN/Ta), titanium, titanium nitride, cobalt, ruthenium, and manganese, for example. The metal lines 102 are associated with a first layer, and the subsequent figures show the formation of vias to the metal lines 102 according to one or more embodiments.

Figure 2:
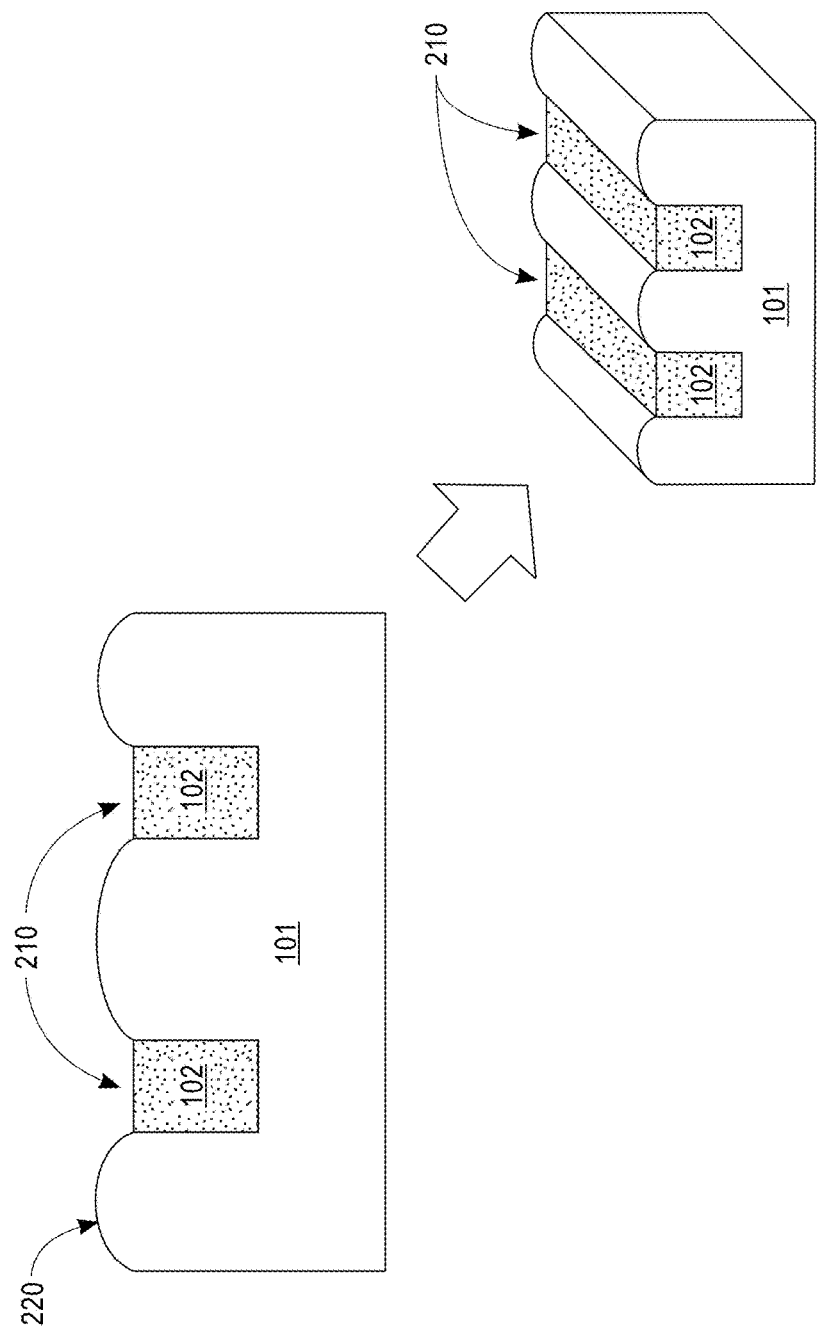

FIG. 2 shows the intermediate structure that results from etching the metal lines 102. Both a front view and isometric view are shown. According to an exemplary embodiment, a reactive ion etch (RIE) process is used to recess the metal lines 102. According to alternate embodiments, a wet etch process may be used. When a metal liner is included in the metal lines 102, the bulk of the conducting line can be removed in a separate step from the metal liner. The two exemplary recessed openings 210 can be formed at the same time or in turn. The depth of the two exemplary recessed openings 210 shown in FIG. 2 can be different or the same and may be on the order of 5 to 50 nanometers. The recessing of the metal lines 102 results in the formation of oxide spacers 220 adjacent to the metal lines 102, as shown in FIG. 2. While the oxide spacers 220 are shown with curved edges according to an exemplary embodiment, the oxide spacers 220 can have straight sidewalls according to an alternate embodiment.

Figure 3:
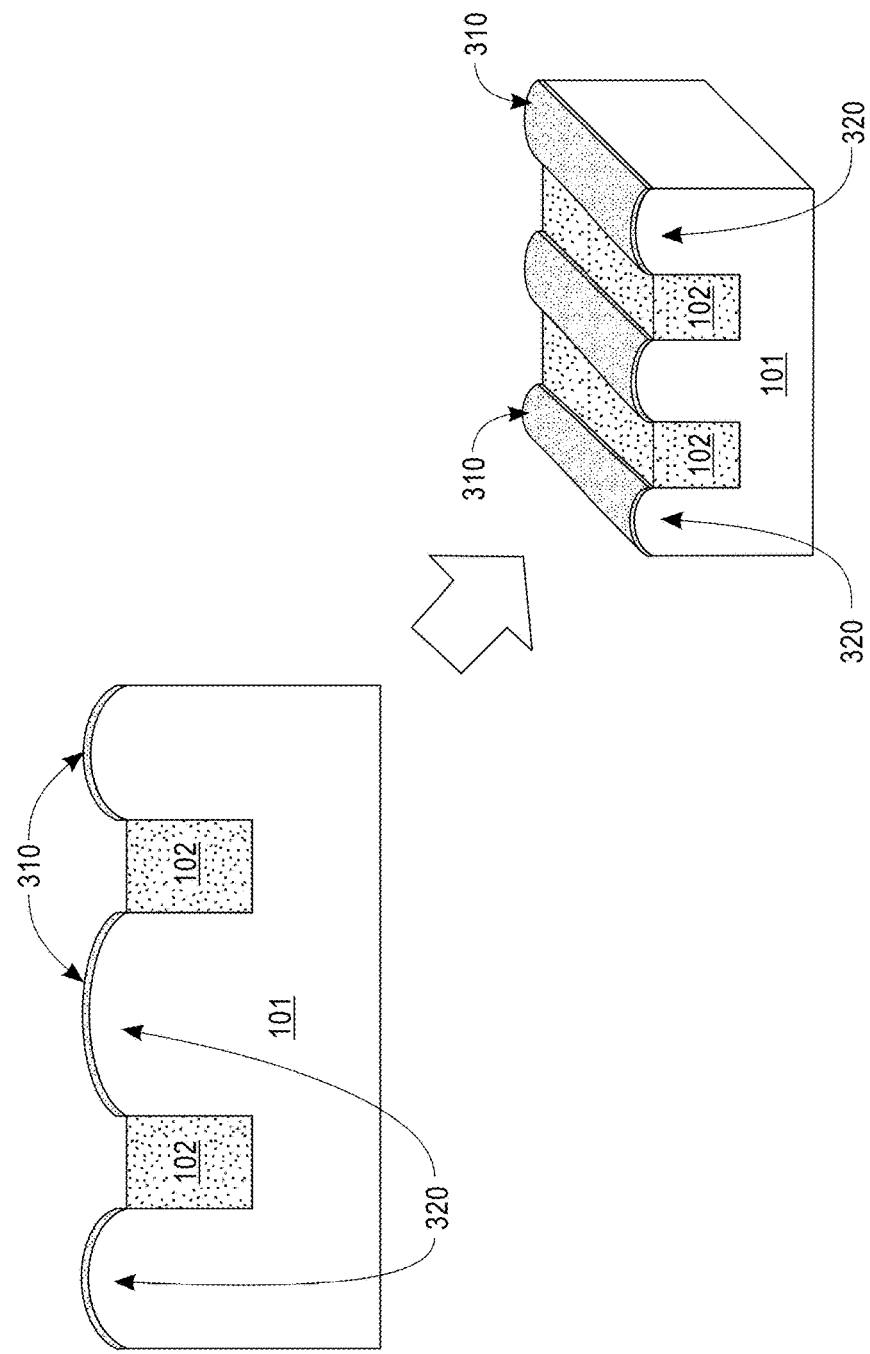

FIG. 3 indicates the metal silicate 310 that is formed according to one or more embodiments. Like FIG. 2, FIG. 3 shows both a front view and an isometric view of the same intermediate structure. Mn is deposited on the intermediate structure shown in FIG. 2. The Mn reacts with the dielectric of the first ILD layer 101 to form a silicate 310 on the exposed oxide spacers 220. The Mn diffuses into the Cu, Co or other material forming the metal lines 102. The oxide spacers 220 with the silicate 310 at the top surface can be referred to as metal silicate etch stop spacers 320. This is because, in the subsequent processes of forming vias above the metal lines 102, the highly selective metal silicate 310 areas adjacent to the metal lines 102 act as an etch stop during the RIE process used to pattern the vias. As compared with a dielectric cap, aluminum nitride (AlN), or the like, the metal silicate 310 has minimal impact on capacitance (k~3.7). Additionally, application of Mn silicate 310 can potentially improve barrier properties such that a thinner dielectric cap 410 may be used in subsequent processes to reduce capacitance.

Figure 4:
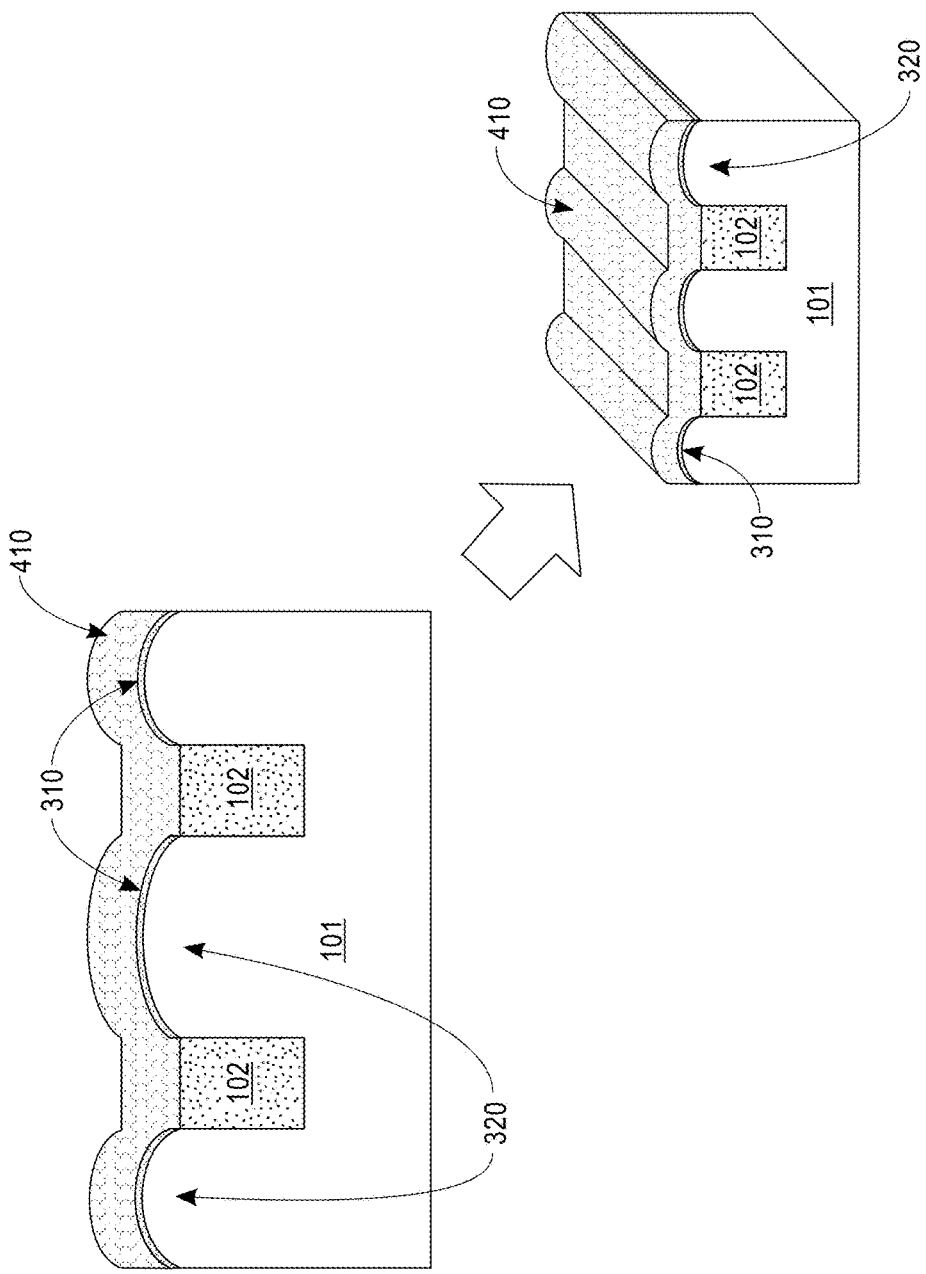

FIG. 4 shows the intermediate structure that results from deposition of a conformal dielectric cap 410 on the intermediate structure shown in FIG. 3. A front view and isometric view are shown. The dielectric cap 410 may be comprised of silicon nitride ($Si_3N_4$), silicon carbide (SiC), silicon carbonitride (SiCN), hydrogen silicon carbide (SiCH), or other known materials. The conformal dielectric cap 410 may be formed via a chemical vapor deposition (CVD), plasma enhanced chemical vapor deposition (PECVD), atomic layer deposition (ALD), or physical vapor deposition (PVD), for example.

Figure 5:
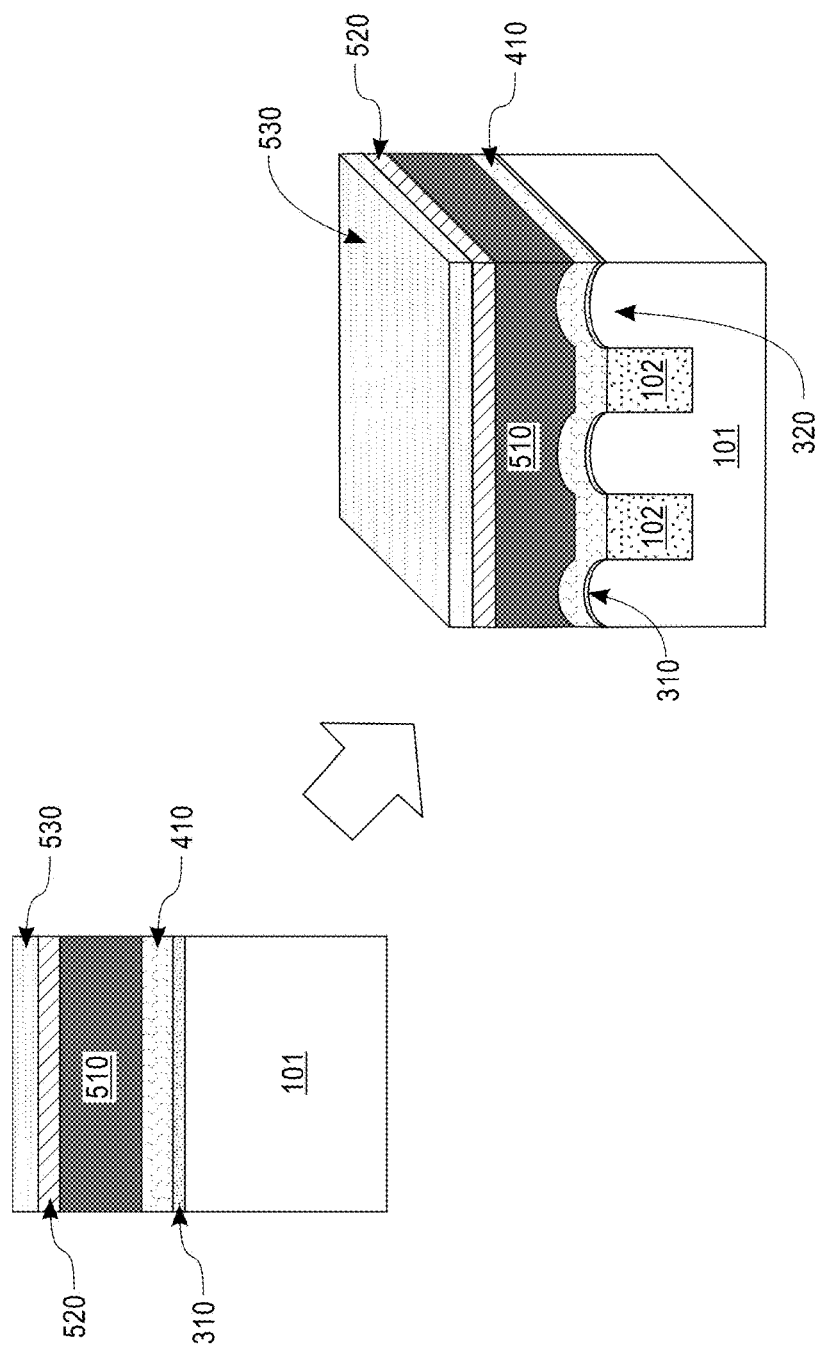

FIG. 5 shows side and isometric views of an intermediate structure resulting from processing of the intermediate structure shown in FIG. 4. A second ILD 510 is deposited on the dielectric cap 410. The second ILD 510 may be any known ILD and may be comprised of a material that is substantially similar to the material of the first ILD layer 101. The second ILD 510 may be formed by PECVD, for example, and may be planarized via a chemical mechanical polishing (CMP), for example. A higher level hardmask 520 is formed on the second ILD 510. The higher level hardmask 520 can be any known masking material such as silicon nitride (SiN). The higher level may be the second level of the device, for example. A metal trench hardmask 530 is formed on the higher level hardmask 520 and may also be any known masking material such as titanium nitride (TiN), for example. The higher level hardmask 520 and metal trench hardmask 530 can be different materials to allow for subsequent etching of the metal trench hardmask 530 selective to the higher level hardmask 520 with the higher level hardmask 520 acting as an etch stop.

Figure 6:
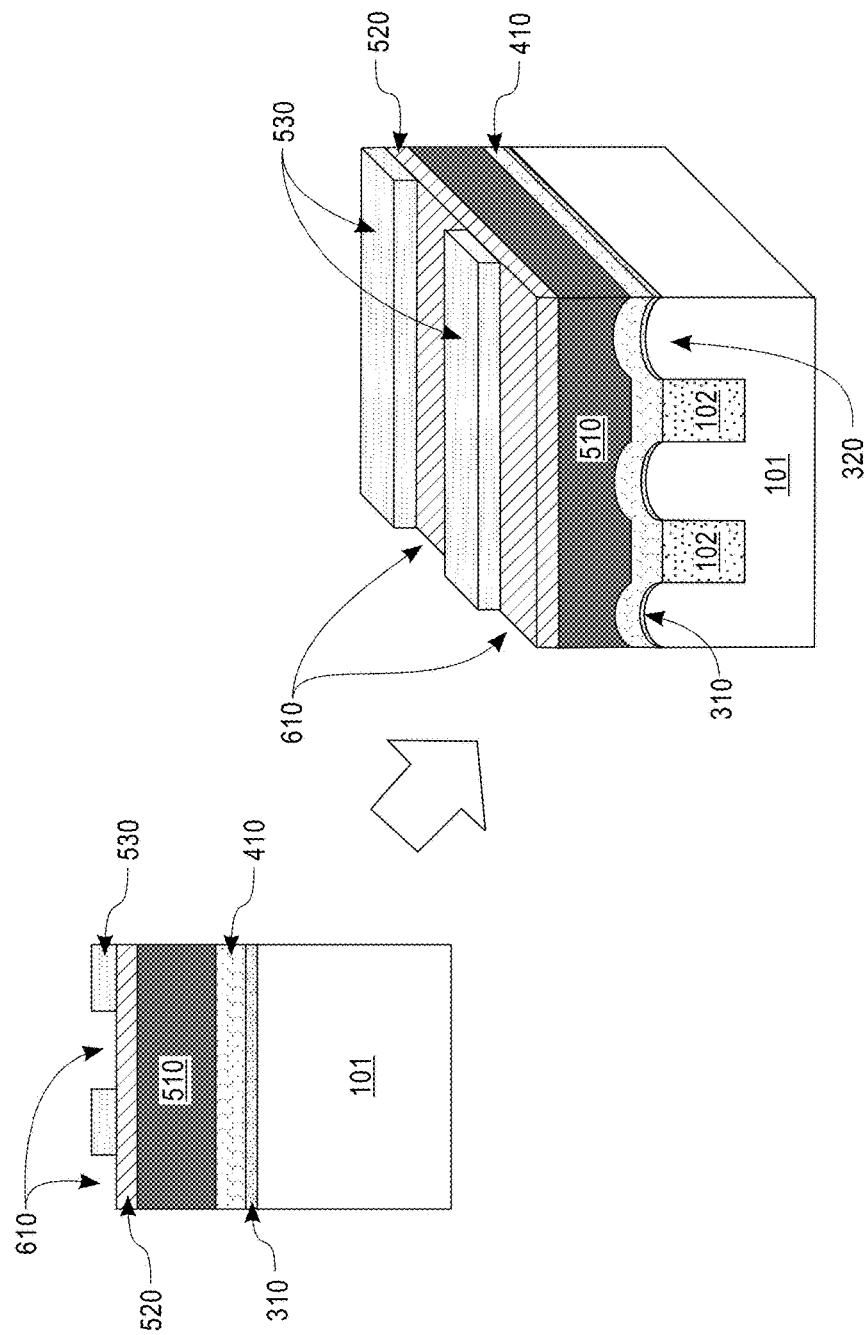

FIG. 6 shows the result of etching a metal trench pattern 610 in the metal trench hardmask 530 according to an embodiment. A side view and an isometric view are shown in FIG. 6. A known etching technique such as RIE, for example, can be used to etch the metal trench hardmask 530. The higher level hardmask 520 acts as an etch stop when portions of the metal trench hardmask 530 are removed selective to the higher level hardmask 520 to form the metal trench pattern 610. The metal trench pattern 610 runs perpendicular to the metal lines 102 and overlaps at least a portion of the metal lines 102.

Figure 7:
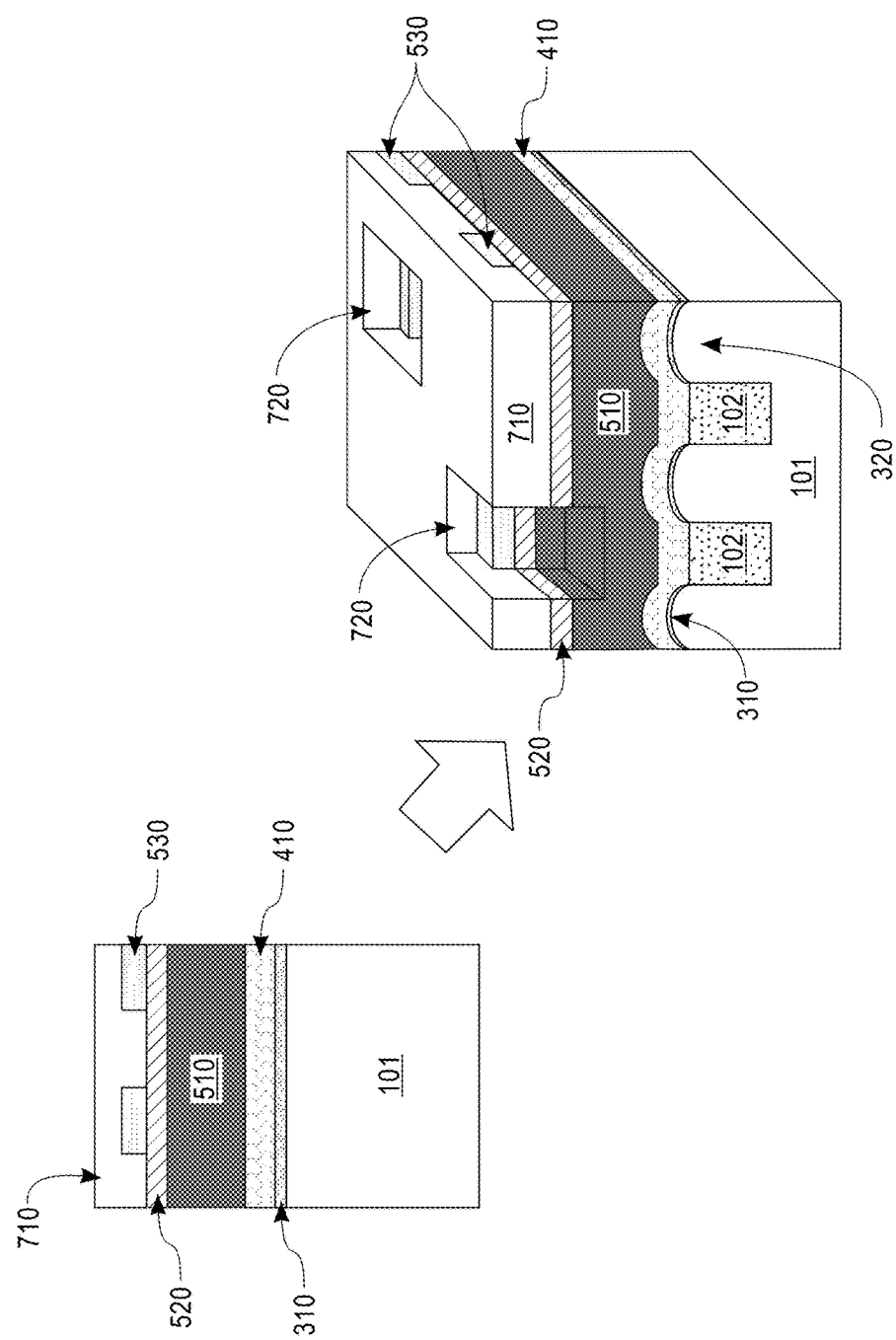

FIG. 7 includes both a side view and an isometric view that shows via patterns 720 formed in a via pattern material 710. The lithographic via pattern material 710 is formed on the higher level hardmask 520 in the metal trench pattern 610 and also above the metal trench hardmask 530 remaining in the structure shown in FIG. 6. The via pattern material 710 can include any known masking materials used in lithography such as organic resist coatings or patterning layers, for example. The via pattern material 710 may be formed by spin coating and can be comprised of multiple layers. The via patterns 720 are etched through the via pattern material 710.

The via patterns 720 can be any shape such as, for example, square, rectangle, circle, or an irregular shape. Generally, the via patterns 720 are defined to intersect both the metal trench pattern 610 and the corresponding metal line 102. While the via patterns 720 may be misaligned relative to the desired location of the higher level metal line, the via patterns 720 may be self-aligned by the metal trench hardmask 530 because of the selectivity of the etching technique. That is, forming the via patterns 720 by etching the via pattern material 710 is selective to the metal trench hardmask 530. Thus, the metal trench hardmask 530 acts as an etch stop in the lateral (front-to-back) direction while the via pattern material 710 that fills the metal trench pattern 610 facilitates etch down to the second ILD 510. The via patterns 720 can be achieved through a RIE process, for example.

Figure 8:
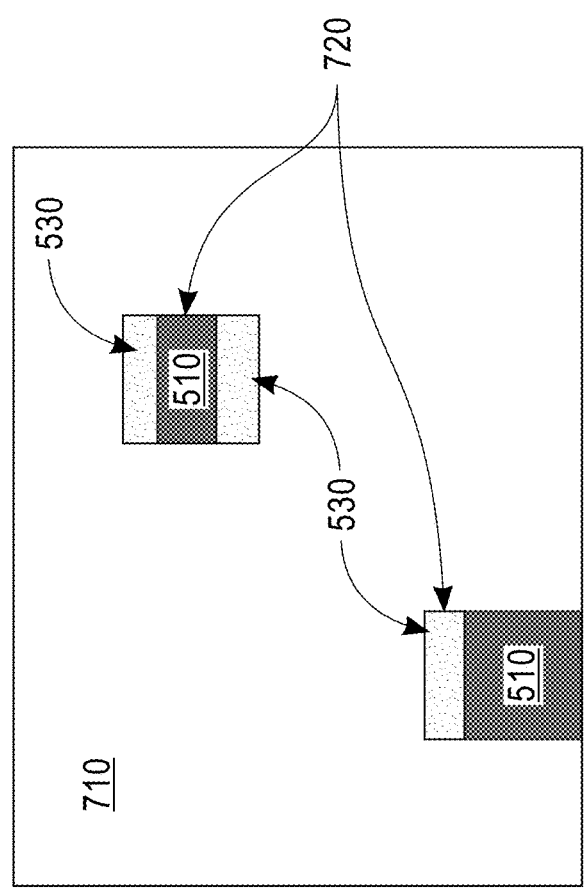

FIG. 8 is a top view of the structure shown in FIG. 7. The via patterns 720 reveal the second ILD 510 and metal trench hardmask 530 below, because the via patterns 720 may overlap a portion of the metal trench pattern 610 and a portion of the metal trench hardmask 530 adjacent the metal trench pattern 610. This overlap of the via patterns 720 to the metal trench hardmask 530 can cause self-alignment of the via patterns 720 to the metal trench hardmask 530. As previously noted, this self-alignment is due to the selectivity of the etching technique, where etching the via pattern material 710 is selective to the metal trench hardmask 530.

Figure 9:
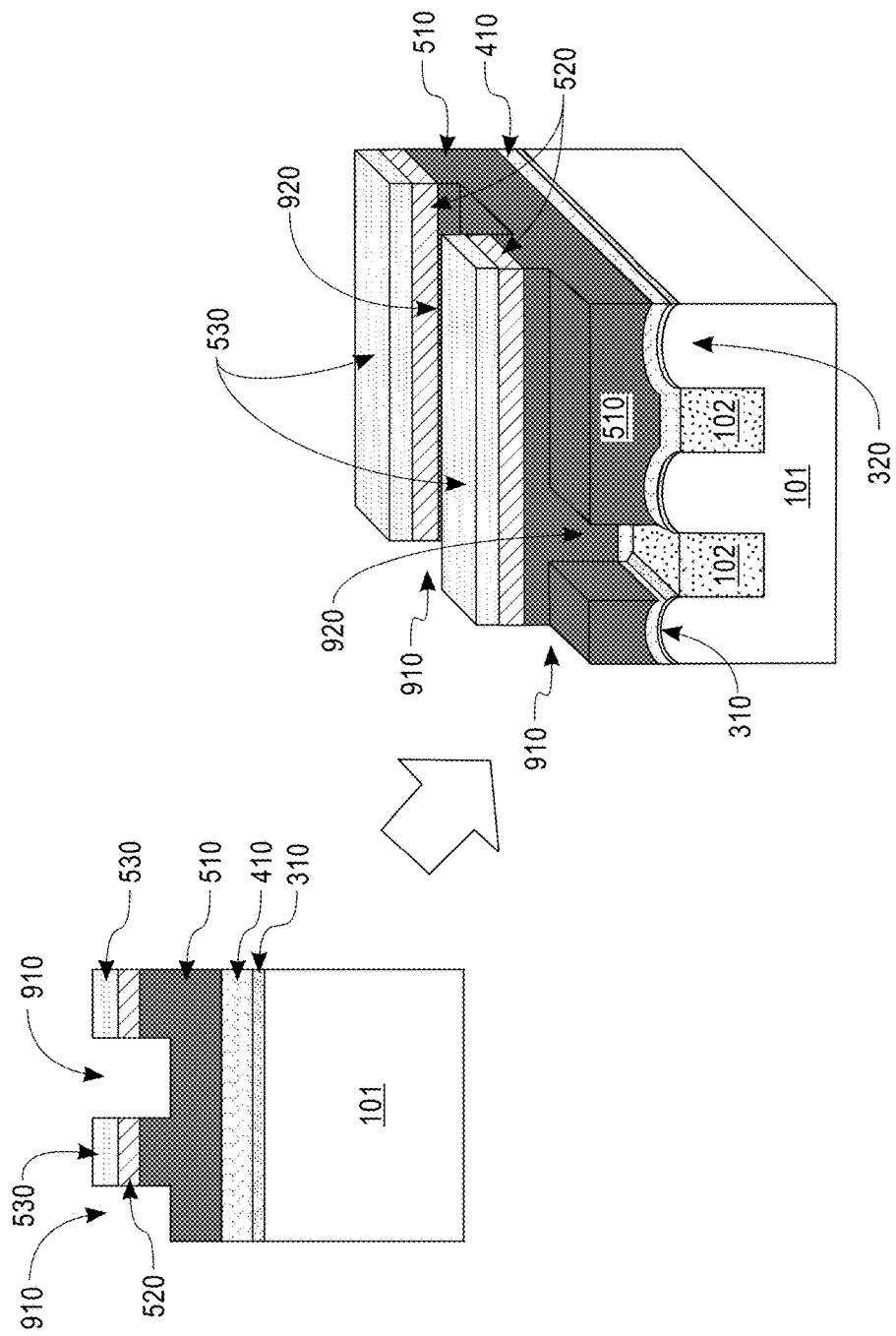

FIG. 9 shows an intermediate structure that results from an etch of the structure shown in FIGS. 7 and 8. Both a side view and isometric view are shown. The via pattern material 710 is removed. Additionally, higher level trenches 910 are etched. The via pattern material 710 can be removed by an RIE process or a strip. The higher level trenches 910 are formed from the metal trench pattern 610 using an RIE process, for example. During formation of the higher level trenches 910, the via patterns 720 are extended to form via openings 920, which extend through the second ILD 510 to the metal silicate 310. The via openings 920 are formed in a portion of the recessed openings 210 (FIG. 2) above the metal lines 102. The via openings 920 are self-aligned to both the metal trench hardmask 530 and the metal silicate 310, and the metal trench hardmask 530 and metal silicate 310 act as an etch stop. That is, the metal trench hardmask 530 aligns the via opening 920 laterally (front to back) while the metal silicate 310 aligns the via opening 920 vertically. By acting as an etch stop, the metal silicate 310 prevents the via opening 920 from extending to the sides of the metal lines 102.

Figures 10, 11:
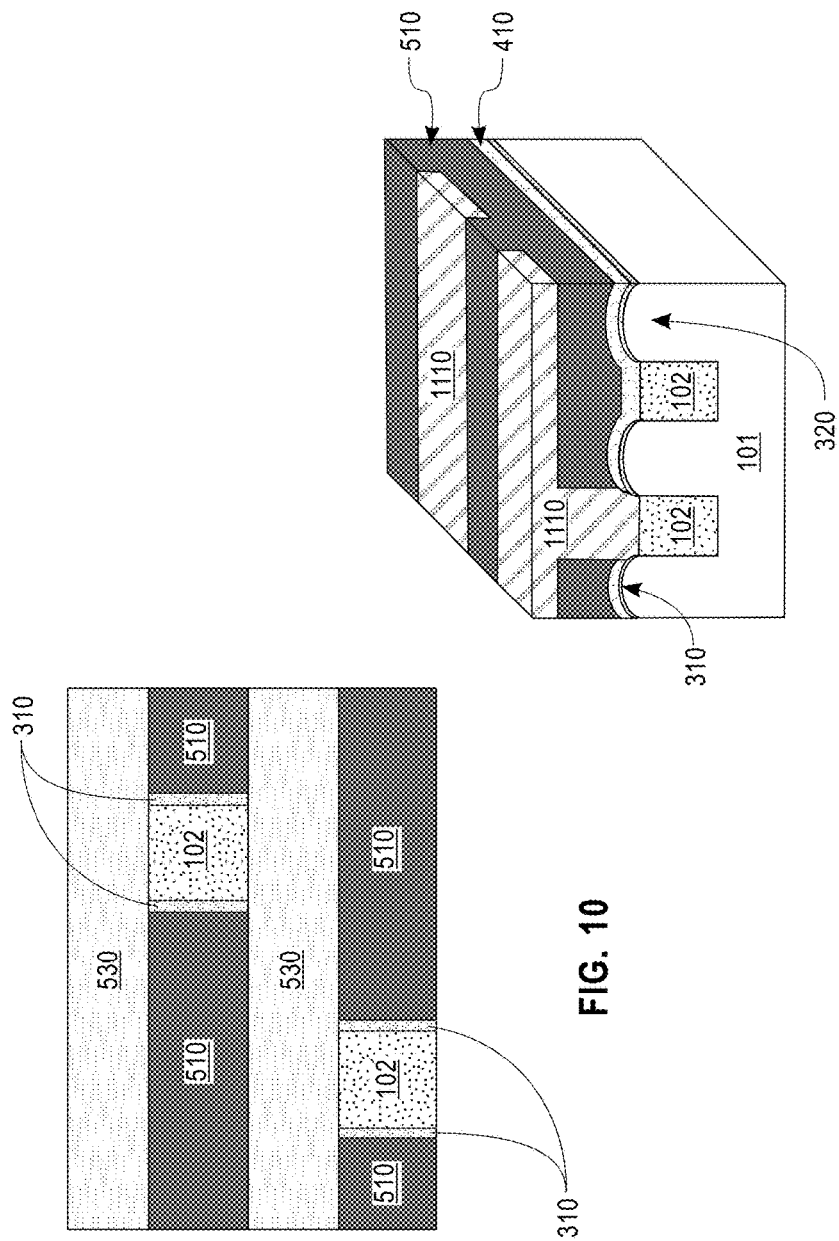

FIG. 10 is a top view of the structure shown in FIG. 9. As FIG. 10 indicates, the via openings 920 expose the corresponding metal lines 102 on the lower level. Some of the metal silicate 310 that acts as the etch stop is also exposed on the sides of the metal lines 102. The second ILD 510 is exposed in the higher level trenches 910.

FIG. 11 shows higher level metal lines 1110 deposited in the higher level trenches 910. The material comprising the higher level metal lines 1110 may be the same or may be different from the material comprising the metal lines 102 and may be fabricated using similar techniques to those discussed with reference to the metal lines 102. As FIG. 11 indicates, the higher level metal lines 1110 extend into the via openings 920 to form the vias 1120. The vias 1120 contact the corresponding lower level metal lines 102 and, thereby, connect the lower level metal lines 102 to the higher level metal lines 1110. Based on the self-aligning processes discussed above, the vias 1120 are fully aligned with the lower level metal lines 102. As FIG. 11 indicates, the higher level hardmask 520 and metal trench hardmask 530 are removed at this stage. Other processes involved in the formation of the full semiconductor device are not shown or detailed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A multi-level semiconductor device, comprising:
    a first interlayer dielectric (ILD) layer with one or more metal lines formed therein;
    a silicide formed on a surface of the first ILD layer, wherein the silicide is directly adjacent to each of the one or more metal lines on both sides of each of the one or more metal lines;
    a second ILD formed above the silicide;
    a via formed through the second ILD above one of the one or more metal lines; and
    one or more second metal lines formed above the second ILD, wherein one of the one or more second metal lines is formed in the via, and the second metal line in the via contacts the one of the one or more metal lines and the silicide adjacent to the one of the one or more metal lines.

2. The device according to claim 1, wherein the silicide is formed on the surface of the first ILD layer conformally.

3. The device according to claim 1, further comprising a dielectric cap formed directly on the silicide, wherein the second ILD is formed on the dielectric cap.

4. The device according to claim 3, wherein the dielectric cap is formed on the silicide conformally.

5. The device according to claim 3, wherein the dielectric cap includes silicon nitride ($Si_3N_4$), silicon carbide (SiC), silicon carbonitride (SiCN), or hydrogen silicon carbide (SiCH).

6. The device according to claim 1, wherein the one or more metal lines and the one or more second metal lines are perpendicular to each other.

7. The device according to claim 1, wherein two or more second metal lines are separated from each other by the second ILD.

8. The device according to claim 1, wherein a second of the one or more second metal lines contacts a second of the one or more metal lines through a second via.

9. The device according to claim 8, wherein the second of the one or more second metal lines contacts the silicide that is directly adjacent to the second of the one or more metal lines.

10. The device according to claim 1, wherein none of the one or more second metal lines extends below a top surface of any of the one or more metal lines.

11. The device according to claim 1, wherein the first ILD layer is a dielectric.

12. The device according to claim 1, wherein the first ILD layer includes porous silicates, carbon doped oxides, silicon dioxides, silicon nitrides, or silicon oxynitrides.

13. The device according to claim 1, wherein the metal lines include a metal liner.

14. The device according to claim 13, wherein the metal liner includes tantalum nitride and tantalum (TaN/Ta), titanium, titanium nitride, cobalt, ruthenium, or manganese.

15. The device according to claim 1, wherein the metal lines include copper (Cu), aluminum (Al), or tungsten (W).

16. The device according to claim 1, wherein the first ILD and the second ILD are comprised of a same material.

17. The device according to claim 1, wherein the via has a rectangular shape.

18. The device according to claim 1, wherein the via exposes a top surface of the one of the one or more metal lines and a portion of the silicide adjacent to the one of the one or more metal lines.

19. The device according to claim 1, wherein the one or more metal lines and the one or more second metal lines are comprised of a same material.

20. The device according to claim 1, wherein the one or more metal lines and the one or more second metal lines are comprised of different materials.

* * * * *